METHOD OF PRODUCING MULTILAYER BODIES OF PREDETERMINED ELECTRIC CONDUCTIVITY

Filed March 6, 1968

Gustav Gärtner
Max Keller
INVENTORS
BY Ernst [illegible]
Michael S. Striker
ATTORNEY 3,546,010

METHOD OF PRODUCING MULTILAYER BODIES OF PREDETERMINED ELECTRIC CONDUCTIVITY

Gustav Gärtner, Gerlingen, Max Keller, Leonberg-Eltingen, and Ernst Zehender, Hohenacker, Germany, assignors to Robert Bosch G.m.b.H., Stuttgart, Germany

Filed Mar. 6, 1968, Ser. No. 711,104
Int. Cl. H05k *3/06*
U.S. Cl. 117—212 14 Claims

ABSTRACT OF THE DISCLOSURE

Printed circuits including superposed layer portions of selective electric conductivity are produced by forming on a partially masked face of a support two superposed metal layers of different composition arranged directly adjacent and in contact with each other, masking a portion only of the free upper face of the upper of the two superposed metal layers, removing the unmasked portion of the upper metal layer preferably by etching without attacking the underlying metal layer, and dissolving the masking which underlies a portion of the lower of the two metal layers so as to remove such portion of the lower metal layer together with the dissolved masking, whereby predetermined portions of the two contacting metal layers corresponding, respectively, to the mask-free portion of the face of the support and the masked portion of the upper metal layer will be retained in contact with each other.

BACKGROUND OF THE INVENTION

The present invention relates to a method of producing multilayer bodies of predetermined electric conductivity and is particularly suitable for producing printed circuits and portions thereof which comprise several electrically conductive layers which are superposed upon and in contact with each other. The configuration of the respective metal layers is determined by masks or maskings which may be soluble in suitable solvents. The metal layers which are thus produced in predetermined configuration and relationship to each other generally will have a thickness of between 0.005 and 5 microns and a corresponding surface resistance, depending on the composition of the respective metal layer, of between about 0.02 and 400 ohms.

It has been proposed in the production of printed circuits to apply a mask of a chemically soluble material to the face of a support of insulating material and then to apply to the thus partially masked face an even, thin metal layer. Such metal layer is so thin that upon dissolution of the mask covering a portion of the support, the portion of the metal layer which contacts the dissolving mask will be removed together with the latter. In this manner, it is achieved that only such portions of the metal layer will be retained in contact with the insulating support which were located on the portions of the support which had not been covered by the masking. It is important that the metal layer is sufficiently thin so that it will separate from the support together with the dissolution of underlying mask portions.

According to another method, the electrically conductive metal layer is first applied in uniform thickness to a face of the support and thereafter the metal layer is partially covered with a mask of lacquer, paint or similar material. The desired configuration of the printed circuit, i.e. of the portion of the conductive metal layer which has to be retained will then be obtained by chemically etching and thereby removing the portion of the metal layer which is not protected by the superposed lacquer, paint or the like masking. The masking is frequently applied by silk-screening or by offset printing.

Printed circuits such as are primarily used in electronic devices frequently comprise a plurality of superposed metal layers which are arranged on a support and which are produced by repeating for each of the layers the method of applying the same to the substrate. If the layers are applied by masking the face of the substrate or carrier, this requires for each of the superposed metal layers to separately mask the supporting structure, forming the metal layer for instance by vapor deposition and dissolving of the mask. If the layers are to be masked, it is necessary either to produce each metal layer of the printed circuit separately by forming the coherent metal layer on the supporting structure, partially masking the thus-formed layer, etching of the unmasked portions of the layer and dissolving of the mask, or it is necessary to utilize a selective etching method which dissolves from layers of different metals which had been precipitated in superposed relationship, starting with the uppermost layer, individual portions of the individual layers. This requires masking the uppermost layer, etching the unmasked portions of the uppermost layer, dissolving the mask, then masking the next layer which has been exposed by the etching of the unmasked portion of the superposed layer, again etching and dissolving of the mask. This has to be repeated for each metal layer. During the etching of unexposed portions of the uppermost metal layer, the underlying layer is exposed in part and the thus-exposed portion of the underlying layer is then masked, etched, and so forth.

The thin metal layers are generally applied to the substrate by vapor deposition under substantial vacuum, in a manner which is well known to those skilled in the art. For the further treatment of a plurality of superposed layers which were successively applied by vapor deposition of different metals while maintaining throughout the entire series of vapor depositions the desired subatmospheric pressure, the selective etching method is preferred. By utilizing other methods, each metal layer would have to be separately produced after restoring the subatmospheric pressure which had been interrupted during the removal of portions of the previously formed metal layer by, for instance the masking method.

However, the selective etching method is connected with the disadvantage that great limitations are placed on the choice of materials for the metal layers, etching agents, solvents and mask, since the etching solutions or solvents must be such that they attack only certain metal layers or masks. Furthermore, it is possible by selectively etching to harm or damage very thin metal layers, by the imprinting of masks thereon and/or by the dissolution of such masks.

It is therefore an object of the present invention to provide a method which overcomes the above-discussed difficulties and disadvantages and which permits in a particularly simple and economical manner and with less restriction with respect to the materials to be employed, to form printed circuits or the like which comprise several superposed, thin metal layers of the desired configuration.

SUMMARY OF THE INVENTION

The present invention proposes to produce a multilayer body of predetermined electric conductivity, such as a printed circuit or a portion thereof by forming on a partially masked face of a support two superposed metal layers directly adjacent and contacting each other, masking a portion only of the free upper face of the upper of the two superposed metal layers, removing the unmasked portion of the upper metal layer, and dissolving the masking underlying a portion of the lower of the two metal layers so as to simultaneously also remove the portion of the lower metal layer.

The novel features of the invention which are considered as characteristic for the invention are set forth in particular in the appended claims. The invention itself, however, both as to its construction and its method of operation, together with additional objetcs and advantages thereof, will be best understood from the following description of specific embodiments when read in connection with the accompanying drawing.

DESCRIPTION OF THE PREFERRED EMBODIMENTS

Figure 1:
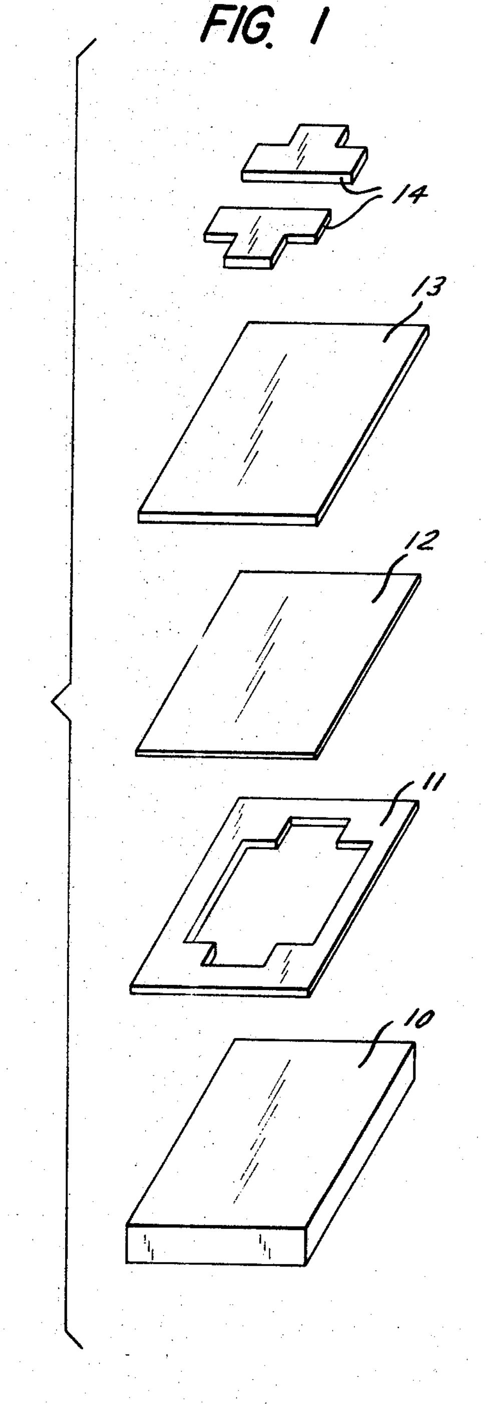
FIG. 1 is a perspective, exploded view of a support, two metal layers and two masks which may be assembled for carrying out the process of he present invention.

The method of the present invention for producing multilayer bodies of predetermined electric conductivity and configuration of at least some of the layers, such as printed circuits and the like, is carried out by partially masking a face of a support or carrier and forming on the partially masked face two superposed metal layers of different composition. The free upper face of the upper metal layer is then partially masked so as to be protected at the masked portions against the effect of an etching liquid and such etching liquid is then applied so as to etch off, dissolve and thus remove the portions of the upper metal layer which were not protected by masking. The masking which had been applied to the support is then dissolved and, upon dissolution thereof, will be removed together with the portions of the lower metal layer which were in direct contact with the now-dissolved mask. In this manner, there is retained on the support the portion of the lower metal layer which was not directly superposed upon the masking interposed between the support and the lower metal layer, and the portion of the upper metal layer which had been protected by the masking applied thereto.

By this combination of masking the supporting face for selectively removing portions of the lower metal layer and masking the upper face of the upper metal layer for selectively removing portions of the latter, one step of the conventional selective etching, namely, the etching of the lower metal layer, will not be required. The method of the present invention, furthermore, gives greater freedom with respect to the choice of the composition of the metal layers, the eaching agents and the masks since no etching agent is required for the lower metal layer. Since the lower metal layer is no longer imprinted with a superposed mask, it is possible to make the lower metal layer extremely thin and sensitive. As compared with the first-described prior art method, namely the separate application of masks to the upper faces of each of the superposed metal layers, it is possible according to the present method to apply both metal layers in one continuous operation under subatmospheric pressure by successive vapor deposition. Thus, the vapor deposition device has to be evacuated only once. Furthermore, as compared with the repeated masking, i.e., the masking of each individual layer prior to application of the superposed layer, one etching step and one step of mask removal will be saved.

When it is required to produce printed circuits with more than two superposed electrically conductive layers, the method of the present invention may be repeated utilizing the printed circuit including two superposed metal layers and formed in a first carrying out of the method as the support for repeating the method, so that, for instance by carrying out the method twice, a total of four superposed different metal layers may be formed.

It is of course also possible to form the third metal layer or a plurality of additional metal layers in one vapor deposition sequence without intermediate breaking of the vacuum by successively vapor depositing as many metal layers as desired and to shape the upper metal layers, above the first and second layer, by more or less conventional selective etching.

The invention will now be further described by the following Examples which simultaneously shall serve for a detailed description of the drawing.

Referring first to FIG. 1 of the drawing, reference numeral 10 denotes a support, for instance of hard paper. A mask 11 having a thickness of 20 microns and consisting of an asphalt paint is then imprinted upon carrier 10. Thereafter, by vapor deposition, successively, first a metal layer 12 having a thickness of 0.01 micron and consisting of a chromium nickel alloy is applied by vapor deposition and thereafter a copper layer 13 having a thickness of 5 microns. A further mask 14 consisting of asphalt paint and having a thickness of about 20 microns is then imprinted upon the free upper face of metal layer 13. The surface resistance of layer 12 is about 200 ohms and the surface resistance of layer 13 about 0.09 ohm.

Mask 14 is so shaped and applied that it will cover the zones of layer 13 which in the completed printed circuit or the like are to form conductive conduit portions or terminals.

Figures 2, 3, 4, 5, 6:
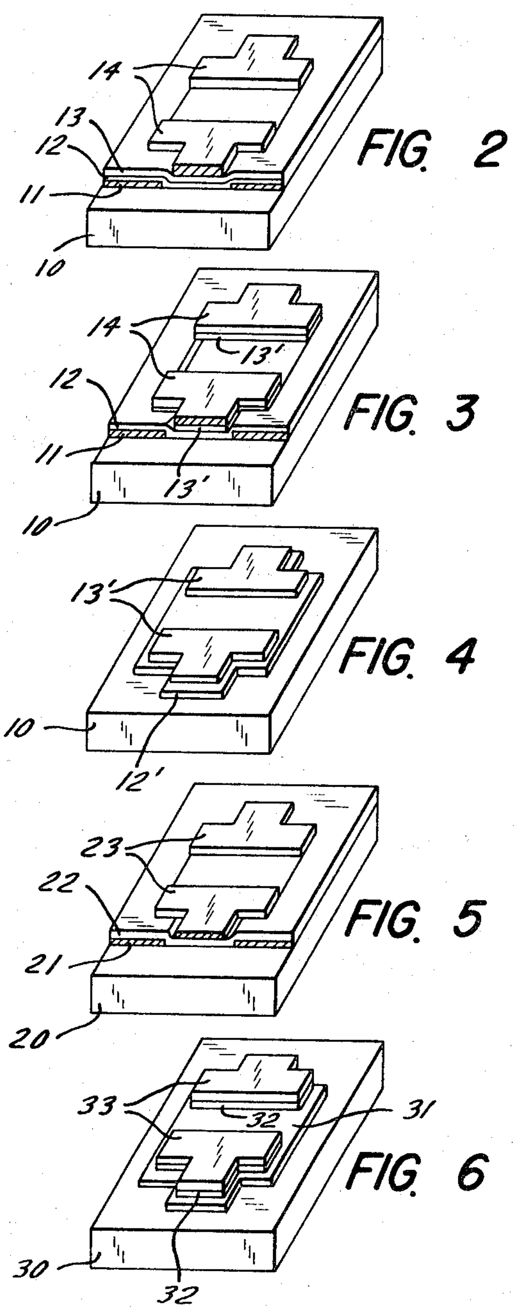
FIG. 2 is a perspective view, partially in cross-section, of the assembled elements of FIG. 1.
FIG. 3 illustrates the assembly of FIG. 2 after etching of the upper metal layer.
FIG. 4 illustrates the completed printed circuit portion of resistance which is formed by removing the masks and thereby also a portion of the lower metal layer from the structure of FIG. 3.
FIG. 5 illustrates an embodiment, according to which the upper mash has been removed; however, the lower mask, i.e., the mask below the lower metal layer is temporarily retained.
FIG. 6 illustrates the structure of FIG. 5 after removal of the lower mask and the directly superposed portions of the lower metal layer.

After thus forming a structure as illustrated in FIG. 2, the portions of copper layer 13 which are not covered by mask 14 are removed by etching, for instance with an iron chloride solution. Thereby the structure shown in FIG. 3 will be formed.

After washing and drying, masks 14 and 11 are simultaneously removed by application of a suitable solvent such as trichloroethylene. Thereby, the structure of FIG. 4 is formed consisting of support 10 with the remaining portion 12' of metal layer 12 and the two remaining portions 13' of metal layer 13.

This is accomplished due to the fact that removal of mask 11 will also cause removal of the portions of thin metal layer 12 directly superposed upon and adhering to mask 11. The thickness of layer 12 must not exceed the thickness at which with certainty separation of the portions of the layer in direct contact with mask 11 from the portion of layer 12 which was not covered by mask 11 will be accomplished. The maximum permissible thickness depends on the composition of layer 12 and on the composition and thickness of mask 11, as well as on the specific method utilized for dissolving mask 11. In the presently described case, the thickness of layer 12 should not exceed 0.015 micron.

Mask 14 is preferably of such shape that it will not be superposed over portions of mask 11 since, otherwise, in the thus-superposed zones not only the resistance layer 12 but also not-removed portions of copper layer 13 would be superposed upon mask 11. In such case, it might happen that mask 11 could not be dissolved or, if dissolved, would not cause removal of superposed metal layers due to the stability of relatively thick copper layer 13.

It is also within the scope of the present invention to form mask 14 of a paint which acts as a soldering agent in which case mask 14 may remain on the not-etched portion of copper layer 13, protecting such portion of the copper layer against corrosion and, upon soldering of copper layer 13, acting as a fluxing agent.

As shown in FIG. 4, upon removal of both masks, the support 10 carries the remaining portitons 12′ of layer 12 and these remaining portions carry the remainder 13′ of copper layer 13, whereby the remaining portions 13′ are completely supported by portion 12′ of the lower metal layer.

According to the embodiment illustrated in FIG. 5, the mask 21 superposed upon a support 20 consists of asphalt paint and underlies a high-resistance metal layer 22 of chromium-nickel alloy and a copper layer 23 which metal layers 22 and 23 were applied as described above in connection with FIGS. 1–4. However, the upper mask 14 of FIG. 1 is replaced in this case by a water-soluble mask of polyethylene glycol which after etching off of the portions of copper layer 23 which were not covered by the upper mask will be removed by application of a suitable solvent, such as water, which will not attack metal layers 22 and 23 and lower mask 21. In this manner, the structure of FIG. 5 is obtained which includes lower mask 21 but no upper mask, since the same has been dissolved and thereby removed.

Thereafter, lower mask 21 may be dissolved with trichloroethylene whereby together with the mask the portions of metal layer 22 which were directly supported by mask 21 will be removed so that only the portions of layer 22 which were not directly superposed upon mask 21 will be retained. The thus-obtained end product is identical with that illustrated in FIG. 4.

According to the embodiment illustrated in FIG. 6, the upper mask 33 which is imprinted upon upper metal layer 32 is formed of a protective soldering paint or dye, for instance an alkyd-melamine resin. In this case portions of the metal layers 31 and 32 are removed as well as the carrier mask which is again dissolved with trichloroethylene, upper mask 33 remains in position on top of the remaining portions of layer 32 and the underlying resistance layer 31 to serve as corrosion protection and fluxing agent for the soldering of connecting wires and the like.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims.

1. A method of producing a multilayer body of predetermined electric conductivity, comprising the steps of forming on a partially masked face of a support two superposed metal layers directly adjacent and contacting each other; masking a portion only of the free upper face of the upper of said two superposed metal layers; removing the unmasked portion of said upper metal layer; and dissolving the masking underlying a portion of the lower of said two metal layers so as to simultaneously also remove said portion of said lower metal layer.

2. A method as defined in claim 1, wherein said multilayer body is at least a portion of a printed circuit.

3. A method as defined in claim 1, wherein said unmasked portion of said upper metal layer is removed by etching.

4. A method as defined in claim 1, wherein said two superposed metal layers, respectively, are applied to said support by vapor deposition at subatmospheric pressure.

5. A method as defined in claim 1, wherein of the maskings on said support and on said upper metal layer at least one is applied by printing.

6. A method as defined in claim 1, wherein said masking on said portion of the free upper face of the upper of said two superposed metal layers consists of corrosion-resistant dye and is retained as part of the thus-produced multilayer body.

7. A method as defined in claim 1, wherein said masking on said portion of the free upper face of the upper of said two superposed metal layers consists of a soldering agent and is retained as part of the thus-produced multilayer body.

8. A method as defined in claim 1, wherein said multilayer body comprises more than two superposed metal layers and the method of claim 1 is carried out utilizing as support a multilayer body previously produced by the method of claim 1.

9. A method as defined in claim 1, wherein said masking of a portion of the free upper face of the upper of said two superposed metal layers is in superposed relationship with an unmasked portion of said face of said support, so that upon removal of the unmasked portion of the upper metal layer and of the portion of the lower metal layer contacted by said masking on said face of said support, the entire lower face of the remaining portion of said upper metal layer will be in contact with the remaining portion of said lower metal layer.

10. A method as defined in claim 1, wherein the upper of said two superposed metal layers consists essentially of copper, and the lower of said metal layers consists essentially of a chromium-nickel alloy.

11. A method as defined in claim 1, wherein the upper of said two superposed metal layers consists of a material which is removable by etching with a liquid which will not cause dissolution of the material of the lower of said metal layers.

12. A method as defined in claim 1, and including the step of removing the masking on said portion of the free upper face of said upper metal layer.

13. A method as defined in claim 12, wherein the masking on said face of said support and the masking on the free upper face of said upper metal layer are removed simultaneously.

14. A method as defined in claim 12, wherein the masking on the face of said support and the corresponding portion of the lower of the two metal layers are simultaneously removed after removal of the masking on a portion of said upper of said two superposed metal layers.

References Cited

UNITED STATES PATENTS

| | | |
|---|---|---|
| 3,115,423 | 12/1963 | Ashworth. |
| 3,237,271 | 3/1966 | Arnold et al. |
| 3,434,940 | 3/1969 | Brown et al. |
| 3,447,960 | 6/1969 | Tonozzi. |

ALFRED L. LEAVITT, Primary Examiner

A. GRIMALDI, Assistant Examiner

U.S. Cl. X.R.

96—36.2; 117—5.5, 217; 156—17